(12) United States Patent
Wu

(10) Patent No.: US 7,586,247 B2
(45) Date of Patent: Sep. 8, 2009

(54) BALLAST FOR LIGHT EMITTING DEVICE

(76) Inventor: Jiahn-Chang Wu, No. 15, Lane 13, Alley 439, Her-Chaing Street, Chutung, Hsin-Chu (TW) 310

( * ) Notice: Subject to any disclaimer, the term of this patent is extended or adjusted under 35 U.S.C. 154(b) by 324 days.

(21) Appl. No.: 11/107,267

(22) Filed: Apr. 18, 2005

(65) Prior Publication Data

US 2006/0232179 A1    Oct. 19, 2006

(51) Int. Cl.
*H01J 1/00*    (2006.01)
(52) U.S. Cl. .................. 313/238; 313/503; 313/504; 313/505; 313/506
(58) Field of Classification Search ......... 313/495–512, 313/315; 315/169.3, 169.4; 257/40, 79, 257/81, 84, 99, 103; 428/690; 345/30, 36, 345/44, 45
See application file for complete search history.

(56) References Cited

U.S. PATENT DOCUMENTS

| 3,806,759 | A | * | 4/1974 | Kabaservice et al. | .......... 315/71 |
|---|---|---|---|---|---|
| 4,027,192 | A | * | 5/1977 | Hanak | .......... 313/498 |
| 4,373,145 | A | * | 2/1983 | McCarthy et al. | .......... 313/503 |
| 4,418,118 | A | * | 11/1983 | Lindors | .......... 428/336 |
| 5,084,893 | A | * | 1/1992 | Sekii et al. | .......... 372/46.01 |
| 5,757,138 | A | * | 5/1998 | Tsai | .......... 315/169.3 |
| 6,410,943 | B1 | * | 6/2002 | Enquist | .......... 257/97 |
| 6,611,093 | B1 | * | 8/2003 | Haven et al. | .......... 313/496 |
| 2003/0016361 | A1 | * | 1/2003 | Mank et al. | .......... 356/432 |
| 2003/0132704 | A1 | * | 7/2003 | Aziz et al. | .......... 313/506 |
| 2004/0000866 | A1 | * | 1/2004 | Seo et al. | .......... 313/506 |
| 2004/0119403 | A1 | * | 6/2004 | McCormick et al. | .......... 313/506 |
| 2005/0104508 | A1 | * | 5/2005 | Ozawa et al. | .......... 313/500 |

* cited by examiner

*Primary Examiner*—Joseph L Williams
*Assistant Examiner*—Elmito Breval
(74) *Attorney, Agent, or Firm*—Lowe Hauptman Ham & Berner, LLP

(57) ABSTRACT

A thin resistive layer is connected in series and integrated with a light emitting device as a ballast to stabilize the current through the light emitting device.

4 Claims, 4 Drawing Sheets

BALLAST FOR LIGHT EMITTING DEVICE

BACKGROUND OF THE INVETNION

1. Field of the Invention

This invention relates to light emitting device, particularly to a ballast resistor for stabilizing the current through a light emitting device.

2. Brief Description of Related Art

FIG. 1 shows a prior art light emitting device 10 with no current limiting resistance. If the current flowing the light emitting device is excessive, a resistor 12 should be inserted in series to limit the power consumption within a specified tolerance. In FIG. 1, the limiting resistor 12 is mounted on the same substrate 15 as the light emitting device 10 and is wire bonded to the top electrode 101 of the light emitting device 10 with its bottom electrode 102 resting over the substrate 15 through a thin metal pad over the substrate 15.

Furthermore, due to production variations, there is a distribution of the current through the light emitting device 10. In the middle of the distribution, the majority of the device satisfies the specification. Some devices lying to the left side of the distribution curve have inadequate current to satisfy the specification. Other devices lying on the right side of the distribution curve have excessive current to satisfy the specification. Either inadequate or excessive current reduces the production yield. In production, the light emitting devices must be sorted out to categorize them. Those with excessive currents have shorter life due to burnt-out, and must be sold at lower price or discarded.

In the prior art FIG. 1, a separate ballast resistor 12 is wire-bonded to the light emitting device to ballast the current. However, the separate ballast requires an extra wire bonding step and occupies extra area.

SUMMARY OF THE INVENTION

An object of this invention of to limit the current through a light emitting device within certain limits. Another object of the present invention is to fabricate a ballast resistor without wire bonding. Still another object of the invention is to minimize the area occupied by the ballast resistor.

These objects are achieved by fabricating a ballast resistor integrally with the light emitting device. A thin layer of resistive material is connected in series with the light emitting device. The ballast layer can be either deposited over the top electrode of the light emitting device or deposited under the bottom of the light emitting device

DETAILED DESCRIPTION OF THE INVENTION

Figure 1:
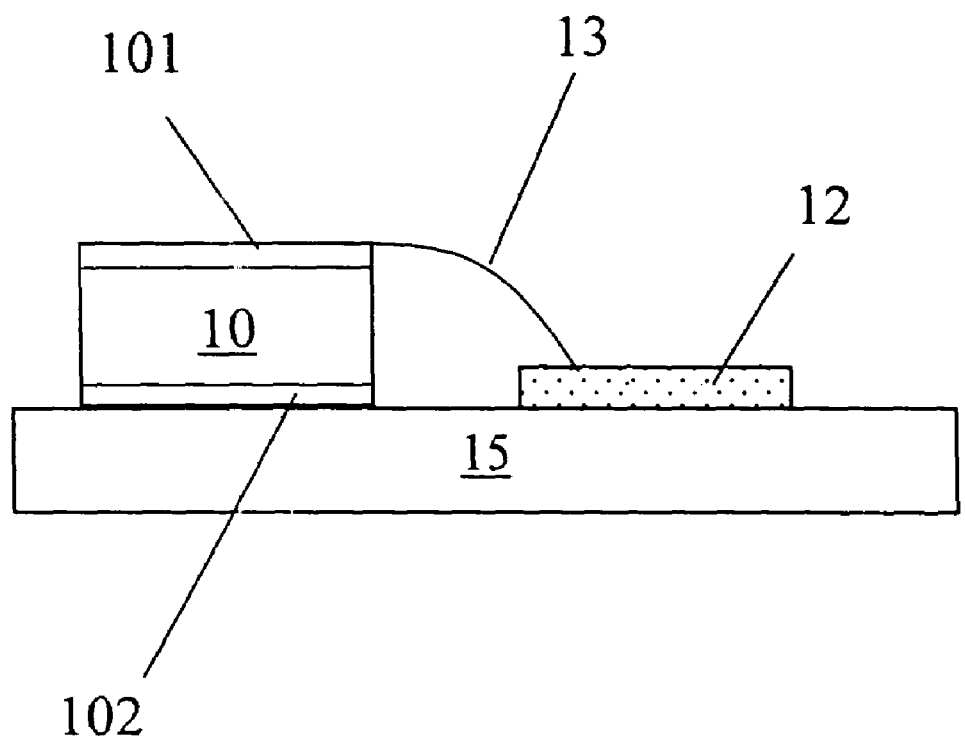
FIG. 1 shows a prior art to connect a ballast resistor in series with a light emitting device.
Figure 2:
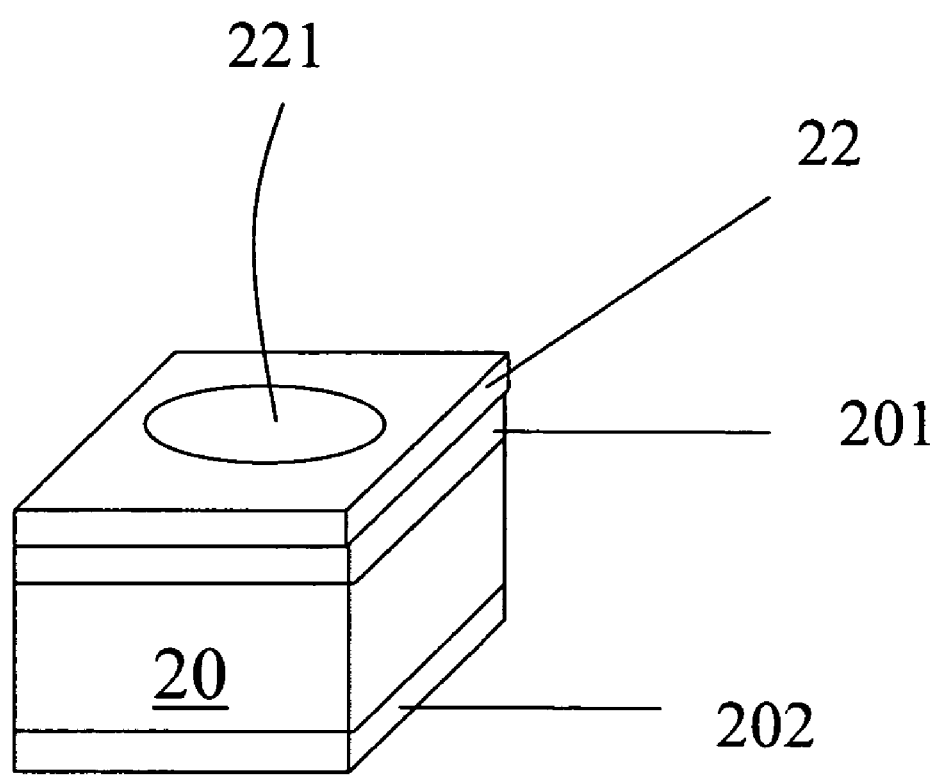
FIG. 2 shows a first embodiment of the present invention with a thin film ballast layer over the top electrode of the light emitting device.

FIG. 2 shows a basic structure of the present invention. A light emitting device 20 is sandwiched between a top electrode 201 and a bottom electrode 202. A thin resistive layer 22 is deposited over the top electrode 201. The resistive layer 22 has a window 221 to allow the transmission of light generated from the light emitting device 20. The lead for the top electrode 201 is attached to the thin resistive layer 22. Since this resistive layer 22 is connected in series with the light emitting device 20, it serves as a ballast to stabilize the current through the light emitting device 20. Furthermore, since the thin layer 22 is integrated with the light emitting device, no extra bonding wire is needed for external connection, and the volume occupied by the structure is minimized.

Figure 3:
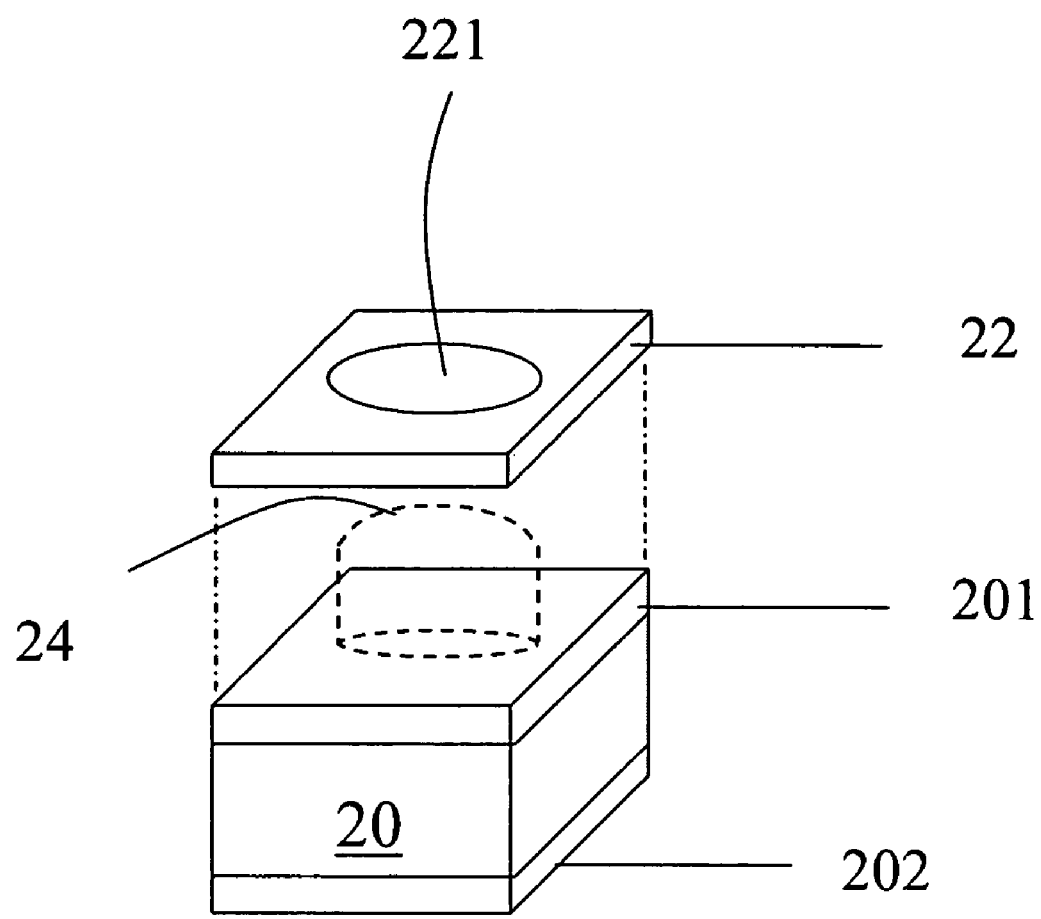
FIG. 3 shows a second embodiment of the present invention including a sealing glue between the top electrode and the ballast layer.

FIG. 3 shows a second embodiment of the present invention. The structure is similar to that in FIG. 2, except that a sealing glue 24 is used to modify the emitted light to focus, be parallel, or diverse. The window 221 of the resistive layer 22 can fit in the sealing glue 24. Other elements correspond to the elements in FIG. 2 with the same reference numerals.

Figure 4:
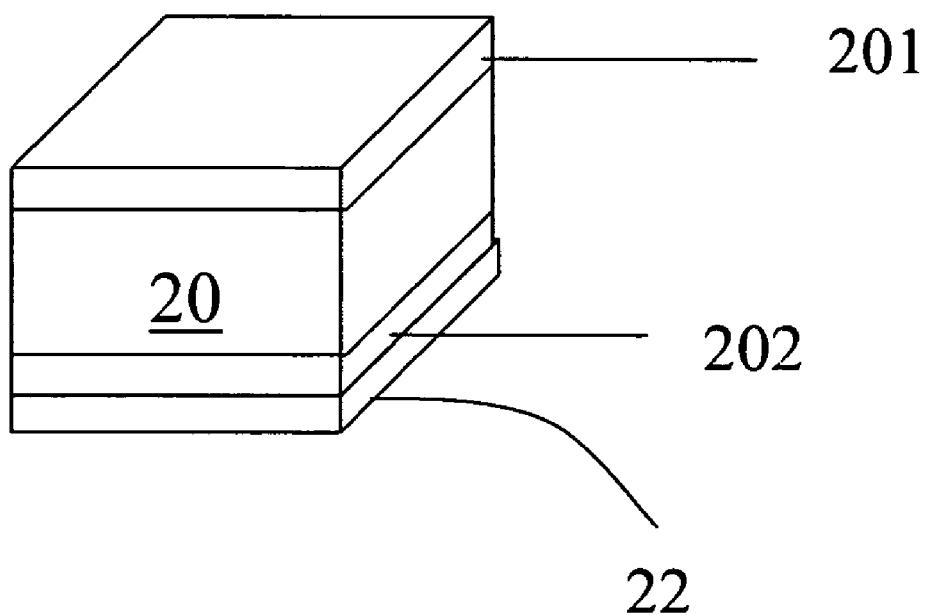
FIG. 4 shows a third embodiment of the present invention with a ballast layer under the bottom electrode of the light emitting device.

FIG. 4 shows a third embodiment of the present invention. The structure is similar to that in FIG. 2 except that the resistive layer 22 is placed at the bottom of the bottom electrode 202, which is attached to an external lead (not shown). The resistive layer 22 is connected in series with the bottom electrode 202 of the light emitting device 20 and serving as an extension end of the bottom electrode 202. It serves the same current limiting function as in FIG. 2. Other elements correspond to the elements in FIG. 2 with the same reference numerals.

While the preferred embodiments of the invention have been described, it will be apparent to those skilled in the art that various modifications can be made in the embodiments without departing from the spirit of the invention. Such modifications are all within the scope of the invention.

The invention claimed is:

1. An integrated light emitting structure, comprising:
   a light emitting device having a top electrode and a bottom electrode; and
   a resistive layer integrated with said light emitting device, completely disposed on and contacting a top surface of said top electrode,
   wherein said resistive layer has an occupation no larger than the surface area of said top surface of said top electrode and defines a ballast resistance to stabilize current in said light emitting device.

2. The integrated light emitting structure as described in claim 1, wherein said resistive layer has a window to allow transmission of light from said light emitting device.

3. The integrated light emitting structure as described in claim 2, further comprising a glue disposed in said window for modifying light emitted from said light emitting device.

4. An integrated light emitting structure, comprising:
   a light emitting device having a top electrode and a bottom electrode; and
   a resistive layer integrated with said light emitting device, completely disposed on and contacting a bottom surface of said bottom electrode,
   wherein said resistive layer has an occupation no larger than the surface area of said bottom surface of said bottom electrode and defines a ballast resistance to stabilize current in said light emitting device.

* * * * *